(12) United States Patent
Seljestad et al.

(10) Patent No.: US 12,363,846 B1
(45) Date of Patent: Jul. 15, 2025

(54) CARTRIDGE FOR INTERCONNECTIVITY AMONG RACK-MOUNTED COMPUTING COMPONENTS

(71) Applicant: Amazon Technologies, Inc., Seattle, WA (US)

(72) Inventors: Kipper Dale Seljestad, Kennewick, WA (US); Chen Zhuang, Sunnyvale, CA (US); Noah Thomas Kelly, Cascade, CO (US); Andrew Charles Crain, Everett, WA (US); Alaa Adel Mahdi Hayder, Gilbert, AZ (US); Alyssa Nicole Benninger, Hardeeville, SC (US)

(73) Assignee: Amazon Technologies, Inc., Seattle, WA (US)

( * ) Notice: Subject to any disclaimer, the term of this patent is extended or adjusted under 35 U.S.C. 154(b) by 347 days.

(21) Appl. No.: 18/109,693

(22) Filed: Feb. 14, 2023

(51) Int. Cl.
   *H05K 5/30* (2025.01)
   *H05K 5/02* (2006.01)
   *H05K 7/18* (2006.01)

(52) U.S. Cl.
   CPC ............ *H05K 5/30* (2025.01); *H05K 5/0247* (2013.01); *H05K 5/0256* (2013.01); *H05K 7/18* (2013.01)

(58) Field of Classification Search
   CPC ...... H05K 5/30; H05K 5/0247; H05K 5/0256; H05K 7/18
   See application file for complete search history.

(56) References Cited

U.S. PATENT DOCUMENTS

| | | | | |
|---|---|---|---|---|
| 5,758,002 A | * | 5/1998 | Walters | G02B 6/44524 |
| | | | | 385/134 |
| 6,102,214 A | * | 8/2000 | Mendoza | H04Q 1/062 |
| | | | | 361/829 |
| 6,181,862 B1 | * | 1/2001 | Noble | G02B 6/44785 |
| | | | | 385/134 |
| 6,468,112 B1 | | 10/2002 | Follingstad et al. | |
| 6,543,626 B1 | * | 4/2003 | Mendoza | H04Q 1/062 |
| | | | | 361/829 |
| 6,796,438 B2 | * | 9/2004 | Mendoza | H04Q 1/062 |
| | | | | 361/829 |
| 6,845,206 B2 | * | 1/2005 | Dwyer | G02B 6/4452 |
| | | | | 385/134 |
| 7,229,050 B2 | * | 6/2007 | Schloss | H05K 7/1491 |
| | | | | 361/826 |

(Continued)

*Primary Examiner* — Anthony M Haughton
*Assistant Examiner* — Theron S Milliser
(74) *Attorney, Agent, or Firm* — Kilpatrick Townsend & Stockton LLP

(57) ABSTRACT

A rack may include a frame having vertical uprights and transverse members coupled together so as to form boundaries of an internal volume of the rack. The boundaries may include a first lateral face, a second lateral face, a front face, and a back face. A cartridge can be installed forward or rearward of the front face and laterally inward from the first lateral face or the second lateral face. Cables may be connected between the cartridge and a plurality of appliances. The cables may include a first cable extending between the cartridge and a first appliance supported by the rack. The cables may further include a second cable extending between a second appliance and the cartridge so as to establish a signal path between the first appliance and the second appliance through the first cable, the cartridge, and the second cable.

20 Claims, 5 Drawing Sheets

(56) References Cited

U.S. PATENT DOCUMENTS

| | | | | |
|---|---|---|---|---|
| 7,391,625 B2* | 6/2008 | Mendoza | | H04Q 1/09 |
| | | | | 361/828 |
| 7,476,804 B2* | 1/2009 | Adducci | | H02G 3/32 |
| | | | | 312/265.2 |
| 7,485,803 B2* | 2/2009 | Adducci | | H02G 3/32 |
| | | | | 312/265.2 |
| 7,495,169 B2* | 2/2009 | Adducci | | H05K 7/186 |
| | | | | 312/265.2 |
| 7,498,512 B2* | 3/2009 | Adducci | | H05K 7/186 |
| | | | | 312/265.2 |
| 7,547,845 B2* | 6/2009 | Azemard | | H05K 7/1449 |
| | | | | 174/72 A |
| 7,715,213 B2* | 5/2010 | Mendoza | | H04Q 1/064 |
| | | | | 361/826 |
| 7,772,489 B2* | 8/2010 | Adducci | | H02B 1/202 |
| | | | | 361/600 |
| 7,880,084 B2* | 2/2011 | Adducci | | H02B 1/202 |
| | | | | 312/265.2 |
| 7,893,356 B2* | 2/2011 | Garza | | H04Q 1/09 |
| | | | | 174/68.3 |
| 7,999,183 B2* | 8/2011 | Garza | | H02G 3/30 |
| | | | | 174/101 |
| 8,138,419 B2* | 3/2012 | Garza | | H04Q 1/09 |
| | | | | 174/101 |
| 8,153,893 B2 | 4/2012 | McSorley et al. | | |
| 8,215,498 B2* | 7/2012 | Rathbone | | H05K 7/1491 |
| | | | | 211/26.2 |
| 8,237,052 B2* | 8/2012 | Adducci | | H05K 7/186 |
| | | | | 312/265.2 |
| 8,273,989 B2* | 9/2012 | Garza | | H02G 3/30 |
| | | | | 174/72 A |
| 8,330,043 B2* | 12/2012 | Alaniz | | H02G 3/30 |
| | | | | 248/68.1 |
| 8,802,978 B2* | 8/2014 | Adducci | | H02B 1/202 |
| | | | | 361/600 |
| 11,483,944 B1 | 10/2022 | Mahdi Hayder et al. | | |
| 11,686,911 B2* | 6/2023 | Sedor | | G02B 6/44524 |
| | | | | 385/135 |
| 11,921,339 B2* | 3/2024 | Sedor | | G02B 6/44528 |
| 11,947,178 B2* | 4/2024 | Sedor | | G02B 6/44524 |
| 2003/0190036 A1* | 10/2003 | Mandoza | | H04Q 1/064 |
| | | | | 379/327 |
| 2003/0228121 A1* | 12/2003 | Dwyer | | G02B 6/44524 |
| | | | | 385/134 |
| 2004/0099771 A1* | 5/2004 | Schloss | | H05K 7/1497 |
| | | | | 248/49 |
| 2005/0092505 A1* | 5/2005 | Mendoza | | H04Q 1/09 |
| | | | | 174/50 |
| 2007/0139868 A1* | 6/2007 | Azemard | | H05K 7/1449 |
| | | | | 361/637 |
| 2007/0210679 A1* | 9/2007 | Adducci | | H02G 3/32 |
| | | | | 312/7.2 |
| 2008/0036339 A1* | 2/2008 | Adducci | | H02B 1/202 |
| | | | | 312/223.2 |
| 2008/0036340 A1* | 2/2008 | Adducci | | H02B 1/202 |
| | | | | 312/223.2 |
| 2008/0067904 A1* | 3/2008 | Adducci | | H05K 7/186 |
| | | | | 312/223.1 |
| 2008/0285252 A1* | 11/2008 | Mendoza | | H04Q 1/068 |
| | | | | 361/825 |
| 2009/0134750 A1* | 5/2009 | Adducci | | H02G 3/32 |
| | | | | 312/223.2 |
| 2009/0147944 A1* | 6/2009 | McSorley | | H04Q 1/03 |
| | | | | 379/454 |
| 2009/0236117 A1* | 9/2009 | Garza | | H04Q 1/09 |
| | | | | 174/100 |
| 2009/0321371 A1* | 12/2009 | Rathbone | | H05K 7/1497 |
| | | | | 211/13.1 |
| 2010/0091449 A1* | 4/2010 | Clidaras | | H05K 7/2079 |
| | | | | 361/679.49 |
| 2010/0101820 A1* | 4/2010 | Alaniz | | H04Q 1/09 |
| | | | | 174/100 |
| 2010/0122830 A1* | 5/2010 | Garza | | H04Q 1/09 |
| | | | | 174/101 |
| 2010/0126750 A1* | 5/2010 | Garza | | H02G 3/30 |
| | | | | 174/100 |
| 2010/0126751 A1* | 5/2010 | Garza | | H02G 3/30 |
| | | | | 174/100 |
| 2010/0264788 A1* | 10/2010 | Adducci | | H02B 1/202 |
| | | | | 312/223.2 |
| 2011/0084580 A1* | 4/2011 | Adducci | | H05K 7/186 |
| | | | | 248/65 |
| 2011/0194269 A1* | 8/2011 | Colongo | | H05K 7/1448 |
| | | | | 361/807 |
| 2012/0267991 A1* | 10/2012 | Adducci | | H05K 7/186 |
| | | | | 312/223.2 |
| 2013/0342091 A1 | 12/2013 | Walker et al. | | |
| 2022/0082773 A1* | 3/2022 | Sedor | | G02B 6/4455 |
| 2022/0082775 A1* | 3/2022 | Sedor | | G02B 6/4455 |
| 2022/0082776 A1* | 3/2022 | Sedor | | G02B 6/3825 |
| 2023/0273385 A1* | 8/2023 | Sedor | | G02B 6/4455 |
| | | | | 385/135 |
| 2024/0176091 A1* | 5/2024 | Sedor | | G02B 6/44528 |
| 2024/0201464 A1* | 6/2024 | Sedor | | G02B 6/4455 |

* cited by examiner

CARTRIDGE FOR INTERCONNECTIVITY AMONG RACK-MOUNTED COMPUTING COMPONENTS

BACKGROUND

Datacenters house collections of servers and networking hardware, including switches and routers. Many different cabled connections between components may be used to, for example, permit data or power transfer between the components. The manner in which cables are managed can become a significant factor in datacenter operations, especially as any excess cabling can have corresponding costs to supply, install, and/or maintain. In addition, cables and/or accompanying structures to guide, retain, route, or otherwise manage cables can occupy significant amounts of space and thus reduce total space that can be available for components that contribute computing power within a datacenter.

BRIEF DESCRIPTION OF THE DRAWINGS

Various embodiments in accordance with the present disclosure will be described with reference to the drawings, in which.

DETAILED DESCRIPTION

Figure 1:
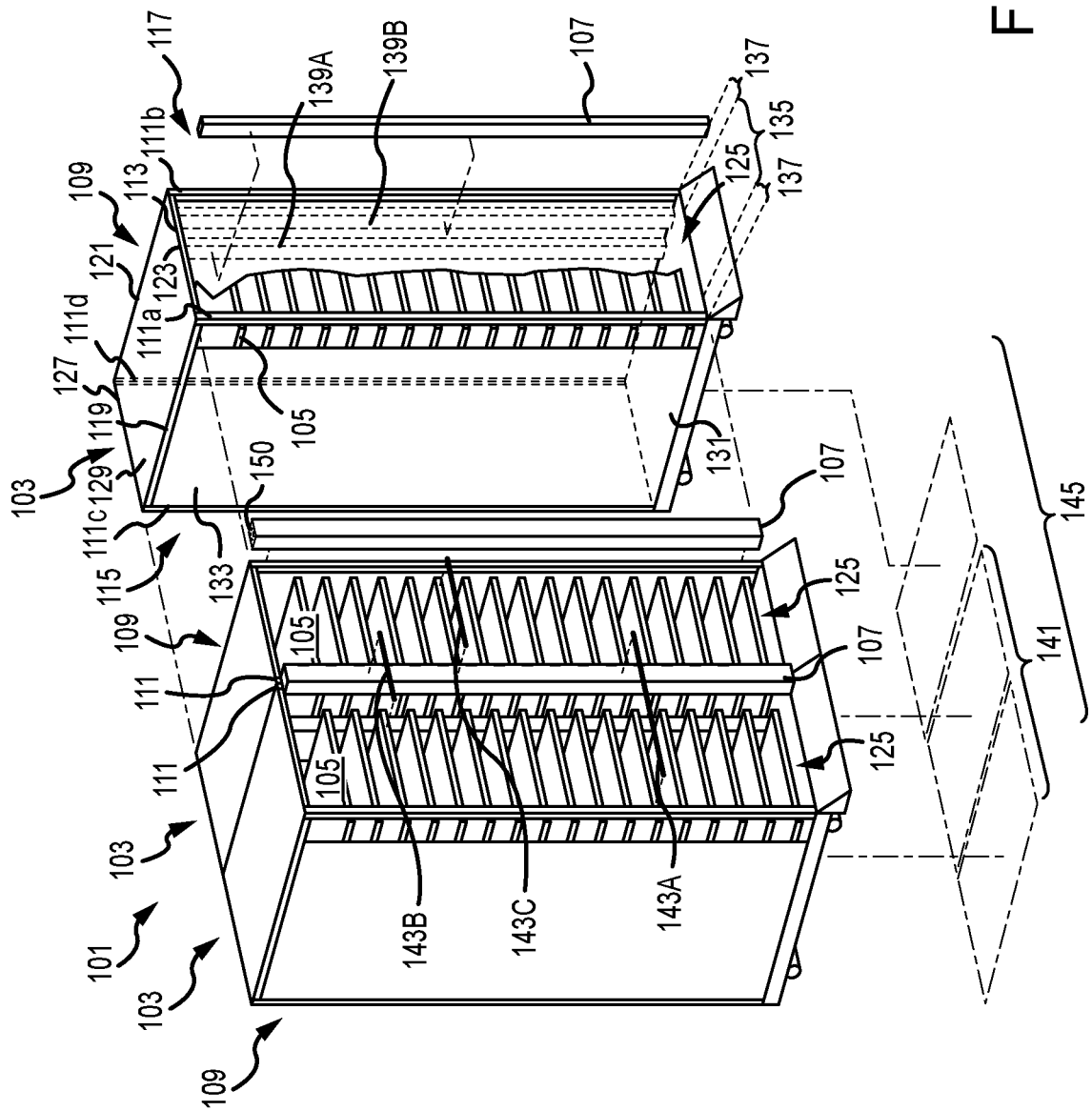
FIG. 1 depicts a front perspective view of a system including cartridges for interconnecting rack-mounted appliances according to various embodiments.

Embodiments herein are directed to connection structures and associated components for computing equipment, such as may be used in computer networks for data centers or other locations. The connection structures can include cartridges that can be installed relative to racks bearing appliances such as computer servers, networking hardware components, or other computing devices.

The cartridges can facilitate rapid installation and/or connection of the appliances to one another within the rack. For example, the rack can arrange the appliances above one another so that ports of the appliances are arranged at different heights, e.g., along a front of the rack. The cartridges can include connectors arranged at similar intervals to the different heights for the ports of the appliances. Thus, installation of the cartridge (such as by mounting behind or in front of a support structure of the rack, such as a front upright, or other relevant front portion of the rack) can provide a suitable interface for routing discrete lengths of cables or other suitable communicative couplers from an appliance port at one height to a connector on the cartridge at the same or similar height.

Fiber optic ribbons, cabling, or other communication channels within the cartridge can provide connection among subsets of cartridge connectors and ultimately facilitate interconnection between different subsets of the appliance ports. As an illustrative example, appliances respectively at a first level and a fifth level may be connected by a path that starts with a cable extending from engagement with an appliance port at the first level to engagement with a cartridge connector at the first level. Continuing this example, the path may continue through a fiber optic ribbon within the cartridge from the cartridge connector at the first level to a cartridge connector at the fifth level. Still continuing this example, the path may conclude with a cable extending from engagement with the cartridge connector at the fifth level to an appliance port at the fifth level. Generally, arrangements that utilize cartridges may leverage discrete lengths of cables to connect between the cartridge and the appliance ports and may be considerably simpler to install and/or manage than if a single continuous length of cable were instead routed each time along all the lateral and vertical segments of each given path between appliances ports at different heights.

The cartridge may be suitably positioned within or directly in front of a front portion of the rack. Such forward placement may avoid lateral incursions that could prevent racks from being arranged directly side by side. Suitable forward placement of the cartridge may allow racks to be arranged with lateral sides abutting or in close proximity. Forward placement of the cartridge may allow a pair of racks to fit within a two-rack footprint rather than occupying a larger-than-two-rack footprint that could result in space usage inefficiencies within a datacenter or other environment.

In various examples, the cartridge may be sized based on a corner upright within the rack. For example, the cartridge may be sized to fit within a width profile of a single upright or may be sized to fit within a width profile corresponding to a size of two corner uprights from adjacent racks positioned directly alongside one another in a two-rack footprint.

The cartridge may be positioned and/or sized to avoid obstructing movement of the appliances relative to the rack. For example, the rack may define a receiving zone in which or through which the appliances may slide or otherwise be movable for installation, removal, upkeep, maintenance, and/or other instances in which access for reconfiguration may be relevant. The cartridge may be installed in a support zone that is distinct from the receiving zone. For example, the support zone may be positioned laterally outward from the appliance receiving zone and/or laterally inward from a lateral face of the rack (e.g., which may be defined at least in part by one or more vertical uprights of the rack). The support zone may be forward or rearward of a front vertical upright that may define a portion of a frame of the rack. In some arrangements, the cartridge may be sized to fit within a space limited by a support zone of a single rack, or the cartridge may be sized to fit within a space defined by adjacent support zones of side-by-side racks.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Turning now to the figures, FIG. 1 depicts a front perspective view of a system 101. The system 101 can include one or more like or different instances of a rack 103, an appliance 105, and a cartridge 107. Generally, the appliances 105 can be received or situated within the rack 103, and the cartridges 107 can be installed to facilitate and/or at least partially provide interconnection among the appliances 105, such as for transfer of data, power, or other signals. During installation, the cartridge 107 may be mounted to the rack 103. The mounting may be direct or via intervening structure to couple with structure of the rack 103. The cartridge 107 is shown arranged for installation relative to a front or forward portion of the rack 103 and away from other components toward a rear or rearward portion of the rack 103, although respective front or rear placement of respective components may be reversed or otherwise different than that depicted in FIG. 1.

The rack 103 can include suitable structure for supporting appliances 105 and associated components. For example, metal or other suitably load-bearing material may be implemented in columns, beams, walls, or other suitable structures. Structure of the rack 103 can be coupled by bolts, screws, or any other suitable fasteners or fastening technique (including, but not limited to, welding, adhesives, or mechanical fasteners). The appliances 105 may be slidably received within the rack 103, such as along rails or other tracks (which are omitted from view for the sake of clarity in FIG. 1).

As may be best seen with respect to the rack 103 shown at right in FIG. 1, the rack 103 can be at least partially defined by a frame 109. The frame 109 can include structure that may define boundaries or other features of the rack 103. For example, the frame 109 may define outer edges of a footprint or outer perimeter of the rack 103.

The frame 109 can include uprights 111 (which may be generally vertically arranged and/or correspond to vertical uprights). The uprights 111 may be coupled together with transverse members 113. In contrast to the uprights 111 that may be generally vertically arranged or otherwise extend in or along a height direction, the transverse members 113 may be generally horizontally arranged or otherwise extend in or along one or more directions other than the height direction. For example, the transverse members 113 may run left-right or otherwise in or along a width direction and/or may run forward-backward or otherwise in or along a depth direction.

In FIG. 1, the uprights 111 are identified as including a front primary vertical upright 111a, a front secondary vertical upright 111b, a back primary vertical upright 111c, and a back secondary vertical upright 111d. A subset of the uprights 111 may correspond to a pair of front vertical uprights that includes the front primary vertical upright 111a and the front secondary vertical upright 111b, for example. Similarly, the uprights 111 can include a subset corresponding to a pair of back vertical uprights that may include the back primary vertical upright 111c and the back secondary vertical upright 111d.

The primary and secondary designations may correspond to respective lateral sides of the rack 103. For example, the rack 103 may define a primary lateral side 115 and a secondary lateral side 117. The primary lateral side 115 may correspond to the left side of the rack 103, and the secondary lateral side 117 may correspond to the right side of the rack 103 (such as represented in FIG. 1), although the designations of primary and secondary may be switched to correspond to right and left respectively in some scenarios.

Elements of the frame 109 can be arranged relative to one another along and/or defining other features or boundaries of the frame 109 or rack 103. For example, the back primary vertical upright 111c may be spaced rearwardly from and laterally aligned with the front primary vertical upright 111a along a primary lateral face 119 of the rack 103. The primary lateral face 119 may be arranged along the primary lateral side 115, for example. The primary lateral face 119 may correspond to a plane or other face that forms an outer extent or boundary of the rack 103. The primary lateral face 119 may be at least partially defined, formed, and/or made up by the front primary vertical upright 111a and the back primary vertical upright 111c.

The back secondary vertical upright 111d may be spaced rearwardly from and laterally aligned with the front secondary vertical upright 111b along a secondary lateral face 121. The secondary lateral face 121 may be arranged along the secondary lateral side 117, for example. The secondary lateral face 121 may correspond to a plane or other face that forms an outer extent or boundary of the rack 103. The secondary lateral face 121 may be at least partially defined, formed, and/or made up by the front secondary vertical upright 111b and the back secondary vertical upright 111d.

The secondary lateral face 121 may be spaced laterally from the primary lateral face 119, e.g., such that each bounds an internal volume 125 of the frame. The internal volume 125 may be bounded along other faces or boundaries, such as along a front face 123 and/or a back face 127. For example, a perimeter of the internal volume 125 may be bounded at least in part by the front face 123, the primary lateral face 119, the back face 127, and the secondary lateral face 121.

The front face 123 and the back face 127 may arranged relative to and/or defined at least in part by other parts of the frame 109. For example, the front secondary vertical upright 111b may be aligned with the front primary vertical upright 111a along the front face 123 of the frame 109. Similarly, the back primary vertical upright 111c and the back secondary vertical upright 111d may be aligned along and/or may each partially define the back face 127 of the frame 109.

The frame 109 may further include a top 129 and/or a bottom 131, which may respectively correspond to a ceiling and a floor. In some embodiments, the bottom 131 may include wheels for maneuvering the rack 103 into position, although brakes or any other fixation structure may be additionally or alternatively implemented to secure the rack 103 in place in use. The top 129 and/or the bottom 131 may form at least a portion of a boundary of the internal volume 125 of the rack 103. In some embodiments, panels 133 may be arranged along multiple features, such as the secondary lateral side 117, the primary lateral side 115, and/or the back face 127, e.g., to at least partially encapsulate or to at least partially enclose the internal volume 125.

The internal volume 125 may include one or more subportions. As one example, the internal volume 125 may include a receiving zone 135. The receiving zone 135 may correspond to a sliding zone and/or may be positioned to facilitate sliding and/or other introduction and/or removal of the appliances 105 relative to the rack 103. For example, the receiving zone 135 may define a plurality of berths. The berths may be sized for receiving electronic appliances 105, e.g., one berth per appliance 105 or other distribution. The berths may correspond to slots that may be defined at least in part by rails, tracks, sliders, or other hardware or structure that may facilitate receiving the appliances 105, for example.

The frame 109 may further define at least one support zone 137. The support zone 137 may correspond to at least a portion of a keep-out zone and/or may be suitably sized and/or positioned to avoid interfering with operations relative to the receiving zone 135. For example, the support zone 137 may be positioned laterally from the receiving zone 135. The support zone 137 may be positioned forward or rearward from one of the front uprights 111a or 111b.

The support zone 137 may be suitably sized and arranged for receiving the cartridge 107. The support zone 137 may correspond to or include an area in which the cartridge 107 can be installed without interfering with sliding or other movement of appliances 105 relative to the receiving zone 135. In various examples, the cartridge 107 can be coupled with the frame 109 so as to be positioned laterally outward from the berths or the receiving zone 135 for the appliances 105 as well as positioned laterally inward from the primary lateral face 119 and/or the secondary lateral face 121.

The support zone 137 (and consequently the cartridge 107) may be arranged forward or rearward of the front face 123 of the frame 109. As some examples of placement rearward of the front face 123, the cartridge 107 at right in FIG. 1 is shown relative to examples of options for installation locations 139a and 139b that are within the internal volume 125 defined by the frame 109. The first inward installation location 139a may correspond to an area nested at least partially within and/or immediately rearward of the front secondary vertical upright 111b, and the second inward installation location 139b may correspond to an area spaced rearwardly from the front secondary vertical upright 111b, although any other suitable position within the internal volume 125 may be utilized. In some examples, the support zone 137 for receiving the cartridge 107 may correspond to and/or be included within a channel or area reserved within the rack 103 for vertical cable management. Some examples of placement forward of the front face 123 are shown in the examples at left in FIG. 1, where the cartridge 107 is shown arranged for installation outside of the internal volume 125 of the frame 109.

The cartridge 107 may be installed relative to a single rack 103 (e.g., as illustrated by way of example with respect to the rack 103 at right in FIG. 1), or the cartridge 107 may be installed relative to more than one rack 103 (such as illustrated by the examples shown at left in FIG. 1). At left in FIG. 1, a first rack 103 and a second rack 103 are shown arranged laterally side by side. The racks 103 can be arranged within a two-rack footprint 141. The two-rack footprint 141 may correspond to a size that is sized to fit two racks 103 (e.g., of the same size as one another) without intervening other structure in between the racks. For example, the racks 103 may be arranged within a two-rack footprint 141 such that one or more portions of the frame 109 of each rack 103 is abutting another part of the other rack 103. Additionally or alternatively, the racks 103 may be positioned such that one of the vertical uprights 111 of the first rack 103 is abutting one of the vertical uprights 111 of the second rack 103. Abutting may correspond to being in contact or may correspond to being sequentially adjacent without intervening structure, for example. Generally, the cartridge 107 may be suitable to install in any position that may facilitate interconnection among other components of one or more racks 103 while avoiding consumption of space that would otherwise result in racks 103 being spaced apart.

The cartridge 107 may be positioned at least partially within the support zone 137 of at least one of the first rack 103 or the second rack 103. As one example, the cartridge 107 shown installed in the leftward portion of in FIG. 1 is shown overlapping respective vertical uprights 111 of the adjacent racks 103. Additionally or alternatively, the cartridge 107 may be positioned at least partially within the support zone 137 of the first rack 103 and at least partially within the support zone 137 of the second rack 103. The respective support zones 137 may be behind or in front of the front face 123, e.g., as described previously.

Generally, the cartridge 107 may include suitable structure to facilitate connection among respective appliances 105. The appliances 105 can include computer servers, network hard drive components, network switches, or other network hardware components or other appliance for a data center or other environment. In some embodiments, the appliances 105 may correspond to a single type of component (e.g., all network switches) or may include combinations of different types of components (e.g., some network switches and some servers). Examples of computing components that may be included within the appliances 105 a printed circuit board, a fan, a solid state drive (SSD), a hard disk drive (HDD), a graphics processing unit (GPU), a heat sink, a cable, a connector, an interface, and/or other elements that may contribute to the operability of the appliance 105. Although listed individually, any of such components may be present singly or in multiples (or absent).

The cartridge 107 can facilitate connection among appliances 105 at different levels within the rack 103 and/or within different racks 103. The appliances 105 may be connected to the cartridge 107 by cables 143, for example.

As one illustrative example, an appliance 105 at a fifth level from the bottom of the leftmost rack 103 in FIG. 1 is shown connected by a first cable 143A to the cartridge 107. A second cable 143B is shown extending from the cartridge 107 to another appliance 105 at a fifteenth level in the same rack 103. As a result, the appliances 105 at the sixth level and fifteenth level within that single rack 103 may be capable of providing communication between one another through a communication pathway that includes the first cable 143A, the cartridge 107, and the second cable 143.

As a different illustrative example, the cartridge 107 may facilitate interaction between appliances 105 in adjacent racks 103. For example, the appliance 105 at the sixth level in the leftmost rack 103 in FIG. 1 may be connected by the first cable 143 to the cartridge 107, while a third cable 143c may provide connection from the cartridge 107 to an appliance 105 at a twelfth level up in the middle rack 103 in FIG. 1.

In some examples, communication may be facilitated among more than two racks 103. As an illustrative example, the pair of racks 103 shown connected by the installed cartridge 107 at left in FIG. 1 may be joined or installed adjacent to a third rack 103, such as the rack 103 at right in FIG. 1. For example, the three racks 103 may be installed within a three-rack footprint 145, e.g., abutting one another or without intervening structure. The cartridge 107 shown exploded from the middle rack 103 may be installed to overlap between the middle and rightmost racks 103 along the uprights 111 or at another suitable location from which cables 143 can extend to reach appliances 105 within the racks 103.

In various arrangements, running individual cables 143 from appliances 105 to the cartridge 107 can allow for straightforward installation, maintenance, and/or decommissioning of system resources. For example, the individual cables 143 for a given appliance 105 may be disconnected to allow the appliance 105 to be moved by sliding or other suitable movement relative to the receiving zone 135. In some examples, cables 143 may remain in place during operation of the system 101 and/or sliding or movement of appliances 105. In various embodiments, use of individual cables 143 may facilitate simpler routing than if non-standardized sizes of cables 143 were utilized to connect over lengths among different appliances 105 as desired for a given arrangement.

Adjacent racks 103 may include a pair in which one is designated an "odd rack" (e.g., the first and leftmost rack in FIG. 1) and in which the other is designated as an "even rack" (e.g., the second and middle rack in FIG. 1). Use of the cartridge 107 may facilitate implementation of a particular set of connections between the odd rack 103 and the even rack 103 that may be readily established by installing the cartridge 107 and connecting the cables 143 at a given level to a portion of the cartridge 107 at that same level. If a different set of connections between appliances 105 in the odd rack and the even rack (and/or between appliances within a given single rack 103) is desired, the cartridge 107 may be replaced by a different cartridge 107 with different internal routing suitable for readily establishing the connections upon connection with cables 143. Such variability may allow ready interchangeability among cartridges 107 with different internal conduit arrangements to rapidly change arrangements of interconnection or signal paths among the appliances 105. Some examples of internal structure that may be utilized in the cartridge 107 to facilitate functionality of the cartridge 107 are described with respect to FIG. 2.

Figure 2:
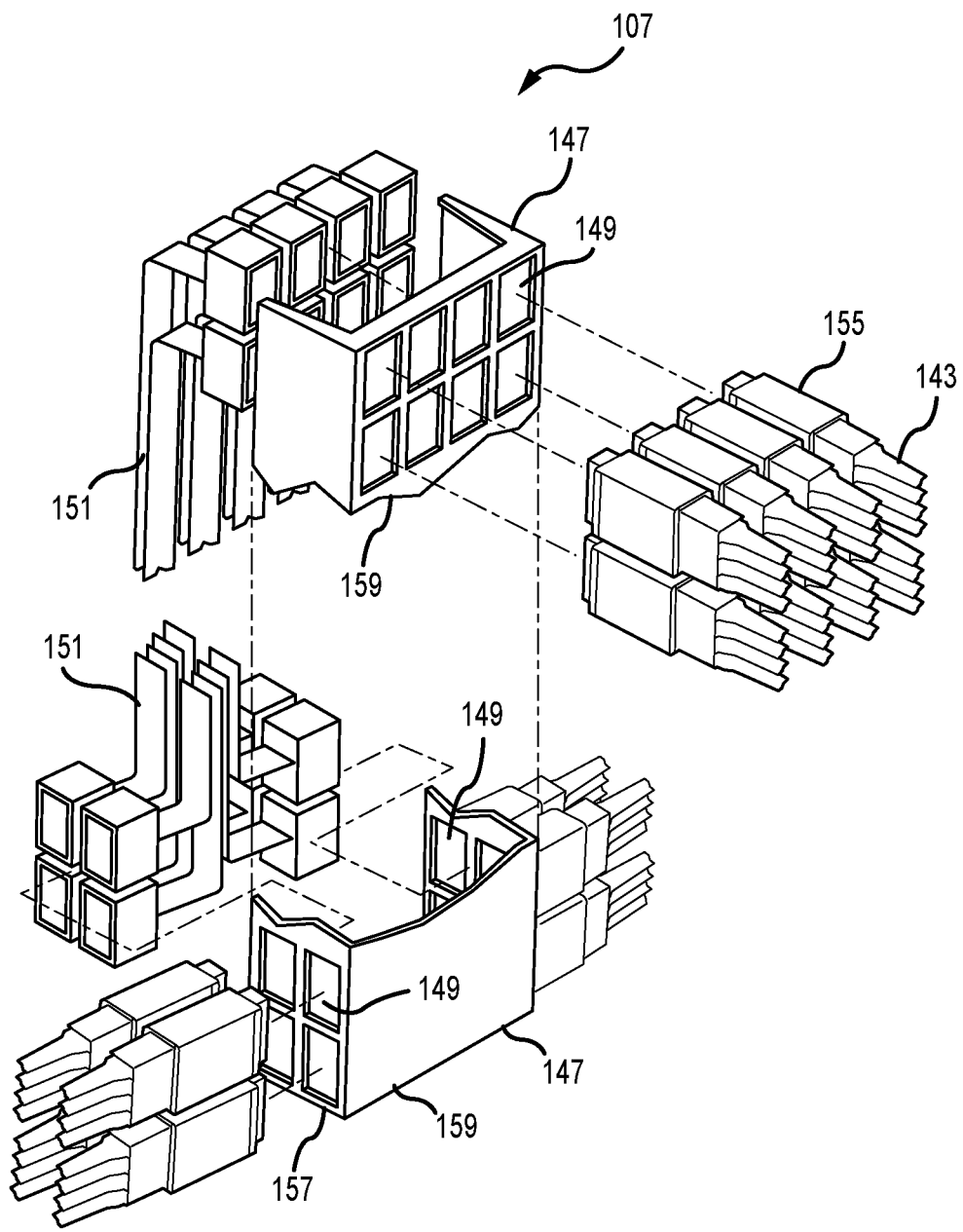
FIG. 2 depicts a partially exploded assembly view of an example of a cartridge for the system of FIG. 1 rack according to various embodiments.

FIG. 2 depicts a partially exploded assembly view of an example of the cartridge 107. The cartridge 107 can include an upright rigid body 147. For example, the body 147 may include a casing or shell formed of metal, plastic, or some other suitable material for the body 147 to be rigid, elongate, and/or upright during use. The cartridge 107 can correspond to a cassette or other form factor of a case or container that can be readily changed and holds contents that may otherwise be difficult, troublesome, or awkward to handle. The body 147 may be hollow or tube-like, e.g., which may facilitate a construction such as that shown in FIG. 2. A series of connectors 149 may be arranged along the upright rigid body 147. The cartridge 107 can include cabling or other suitable communication conduits 151 within the upright rigid body 147.

The conduits 151 may correspond to fiber optic ribbons, fiber optic cables, or other forms of cables. As non-limiting examples, the conduits 151 may include copper, glass, or other materials suitable for transmission of appropriate signals therethrough. The conduits 151 may correspond to any suitable type of cable including, but not limited to, electrical cable (e.g., formed with copper or other electrically conductive cores), fiber optic cables (e.g., formed with a glass or other light-transmitting core or cores), or other types. Generally, the conduits 151 can include suitable wiring, optical fibers, and/or other conduits for transmitting electrical power, data, and/or other signals there through. Although the conduits 151 and associated components depicted and described herein may be particularly suited for optical transmissions, in some aspects, the conduits 151 may be replaced with and/or include a conduit for other connection types, in addition or as alternatives, such as connections for acoustic communication, fluid communication, and/or electrical communication. The conduits 151 may be arranged within an interior volume of the body 147 of the cartridge 107, for example.

The conduits 151 can provide paths among subsets of the connectors 149. For example, a conduit 151 may provide a suitable path for a signal transmission between a connector 149 at one level, altitude, and/or height of the cartridge 107 and may also connect to a connector 149 at another level of the cartridge 107. Each respective conduit 151 may be coupled at one end (e.g., directly or via one or more suitable couplers) to a respective connector 149 and routed through the body 147 of the cartridge 107. Multiple conduits 151 may be connected with a particular connector 149 and may be bundled or otherwise appropriately arranged to facilitate connection with different lanes or channels enabled by the connector 149. Any suitable combination or routing of conduits 151 may be utilized to provide interconnection among subsets of the connectors 149. For example, although the conduits 151 may be implemented with a one-to-one arrangement between coupled connectors 149, the conduits 151 may additionally or alternatively include arrangements of conduits 151 in which many-to-one, one-to-many, or many-to-many arrangements are enabled by the conduits 151.

The connectors 149 can include any suitable interface for engaging with cables 143. For example, the cables 143 may end or terminate in plugs 155 that may be engageable with the connectors 149, such as directly or through suitable couplers to provide structure for facilitating alignment and/or engagement between the plugs 155 and the connectors 149. The plugs 155 and/or the connectors 149 can correspond to opposite mating components of a connection interface that are sized and arranged for engaging one another or may correspond to compatible structures that may be engaged through suitable couplers. The connection interface can facilitate blind-mate engagement, for example. Any suitable male and female portions of the connection interface may be included such that the plugs 155 and/or the connectors 149 may correspond to any suitable set of projections, recesses, or other connecting structure. For example, although FIG. 2 primarily depicts plugs 155 having projections or pins insertable into holes or pin-holes in the connectors 149, either or both of the connector 149 and the plug 155 (or an intervening coupler) may include some protruding structure that is receivable within an opening, may include an opening or other suitable complementary structure suitable for receiving a protrusion from a mating component, or may include some combination of protrusion and receiving structure. As a further illustrative example, although the arrangement depicted in FIG. 2 is shown with connectors 149 that appear substantially flush with a face of the body 147 of the cartridge 107, connectors 149 may additionally or alternatively include structure that is recessed into and/or projecting out from the cartridge 107. Similarly, although the plugs 155 are shown projecting from the cables 143, plugs 155 may additionally or alternatively include structure that is flush and/or recessed relative to an end of the cable 143.

The plugs 155 and/or the connectors 149 can include any suitable form factor and may differ from or be alike to one another. In various embodiments, included structure may correspond to any suitable form factor of pluggable module, pluggable media, pluggable transceiver, or other pluggable component. For example, the plugs 155 and/or the connectors 149 may be sized and arranged to meet any suitable standard for pluggable optical transceivers. In one non-limiting example, one or more of the plugs 155 and/or the connectors 149 may correspond to a small form-factor pluggable (SFP) transceiver, such as is commonly used for telecommunication and/or data communications applications. In another non-limiting example, one or more of the plugs 155 and/or the connectors 149 comprises an enhanced small form-factor pluggable (SFP+) transceiver or a compact small form-factor pluggable (CSFP) transceiver. In an additional non-limiting example, one or more of the plugs 155 and/or the connectors 149 comprises an RJ45 connector or a similar connector. Further non-limiting examples may include QSFP, QSFP+, QSFP28, QSFP56, QSFP56-DD, OSFP, MPO, or other standards that may be known in the art.

The upright rigid body 147 can include one or more lateral faces 157 and one or more direct faces 159. The lateral faces 157 may correspond to a left or right side of the cartridge 107 when installed. The direct faces 159 may correspond to a front or a rear of the cartridge when installed. The cartridge 107 may be arranged to have connectors 149 arranged along one or more lateral faces 157 and/or along one or more direct faces 159. In the example shown in FIG. 2, in an upper portion, the connectors 149 are arranged along a direct face 159, and in a lower portion of the cartridge 107 in FIG. 2, the connectors 149 are arranged along the lateral faces 157. Although the cartridge 107 is shown with a distribution of connectors 149 that differs whether on lateral faces 157 or direct faces 159, the cartridge 107 may be arranged for all of the connectors 149 to be along a single side or along multiple sides according to the arrangement to be implemented. Generally, the plugs 155 may be installed by insertion in a forward or backward direction (e.g., relative to direct faces 159) or a left or right direction (e.g., relative to lateral faces 157) depending on the arrangement implemented for a particular application. Other installation directions and/or connector distributions are also possible. As one example, at least one conduit 151 may be routed to carry signals from one or more connectors 149 that may be arranged in or along a top or bottom of the cartridge 107. As an illustrative example, the connectors 149 may include or operate in conjunction with at least one outside interface 150 (e.g., FIG. 1), which may correspond to a through-opening or connectorized port that may permit cabling to enter through and/or engage along a top (or bottom or other suitable area) of the cartridge 107 such that signals can be introduced into the cartridge 107 from outside of components of the racks 103 or other elements of the system 101 (or pass from the cartridge to such outside components). For example, including an outside interface 150 may allow the cartridge 107 to engage one or more outside channels and permit distribution out to connectors 149 (e.g., FIG. 2) that can allow branching out via cables 143 (e.g., FIG. 1) to appliances 105 in one or more associated racks 103.

Figure 3:
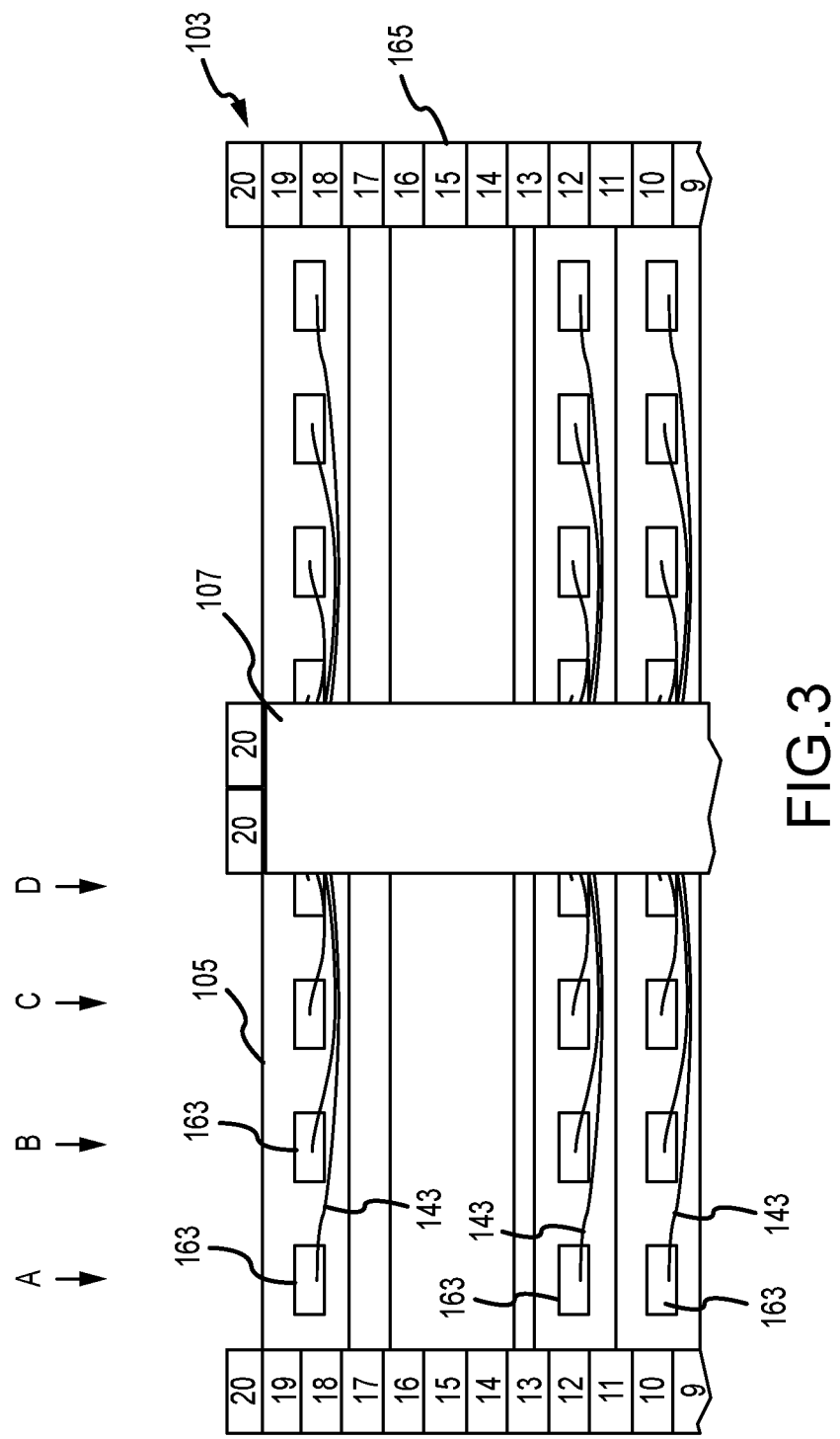
FIG. 3 depicts a front view of an example of a portion of the system of FIG. 1 with a cartridge installed for interconnecting appliances according to various embodiments.

FIG. 3 depicts a further example of a portion of a cartridge 107 installed for interconnecting appliances 105. The appliances 105 may include ports 163. The ports 163 may be arranged along a front of the rack 103 when the appliances 105 are in a fully seated state within the rack 103, such as depicted in FIG. 3, although the appliances 105 may be arranged so that the ports 163 are arranged at any relevant position of accessibility along the rack 103. Although the example in FIG. 3 depicts a set of ports 163 in which four ports 163 are arranged symmetrically within a similar distribution within each depicted appliance 105, ports 163 may be distributed across appliances 105 in any suitable manner. Any appliance 105 may include any suitable number of one or more of the ports 163, and appliances 105 may differ or be alike in number of the ports 163 included. The ports 163 can provide interfaces for connection and transfer of data or other electrical or optical signals or other varieties of signals.

The ports 163 may correspond to any suitable interface. For example, the ports 163 may be compatible with the plugs 155 (FIG. 2) of the cables 143. The cables 143 may include plugs 155 at opposite ends that are like or different from one another. For example, the ports 163 on the appliance 105 and the connectors 149 of the cartridge 107 may be a same type of interface or may correspond to different types of interface (e.g., such that the cables 143 may function as adapters between the ports 163 on the appliance 105 and the connectors 149 of the cartridge 107).

The cables 143 (shown schematically as individual lines for ease of viewing in FIG. 3) may be supplied to extend along a given level of the rack 103. For example, in FIG. 3, the rack 103 is shown with different levels that are denoted by markers 165 that range from a level nine to a level twenty. Different levels may correspond to different increments of rack units in use, for example. For example, appliances 105 may be sized as 1 U in height, 2 U in height, or any other partial or full increment of rack units U.

In operation, the cables 143 may correspond to a series of standardized cables. The cables 143 may be provided or implemented in a set of standard lengths. For example, a set of vertically aligned ports 163 (such as aligned within a column B) may each be connected by a same length cable 143 to extend from the port 163 to the cartridge 107. A different port 163 along the same level (such as within a column A, C, or D) may be suitably connected by a shorter or longer length of cable 143 to reach from the port 163 to the cartridge 107. For example, standardized increments could be utilized so that all of the ports 163 on a given level may reach the cartridge 107.

As an illustrative example, cable lengths of sixteen inches, twelve inches, eight inches, and four inches may be utilized to reach a cartridge on one level and then may extend in similar increments at another level. These lengths are given as examples only, however, and any suitable set of cable lengths can be implemented. In some embodiments, the lengths may be selected or implemented to avoid slack in the cable 143 from sagging down in front of other appliances 105 within the rack 104. Additionally or alternatively, lengths may be selected or implemented to provide adequate distance to permit the cables 143 to remain engaged with the appliances 105 regardless of whether the appliance 105 is fully seated within the rack 103 or positioned at least partially extending from the rack 103 for access to the appliance 105.

Use of discrete lengths of cable 143 may permit usage of a significantly smaller number of cable sizes than if individual cables 143 were run from one column on an appliance 105 along that level to the cartridge 107, through the cartridge 107, and then out to another port 163 on another level of the rack 103. To this end, all ports 163 in column A may use one standardized length of cable 143 to reach the cartridge 107, while a different length of cable 143 that may be shorter may be used to reach from ports 163 in column B, and similarly, a fixed length of cable may be used for column C and a different length of cable for column D. Moreover, a cable 143 connecting to an appliance 105 in one rack 103 may be connected via the cartridge 107 and via a further cable 143 at another level to another appliance 105 within the same rack 103 or within another rack 103.

Figure 4:
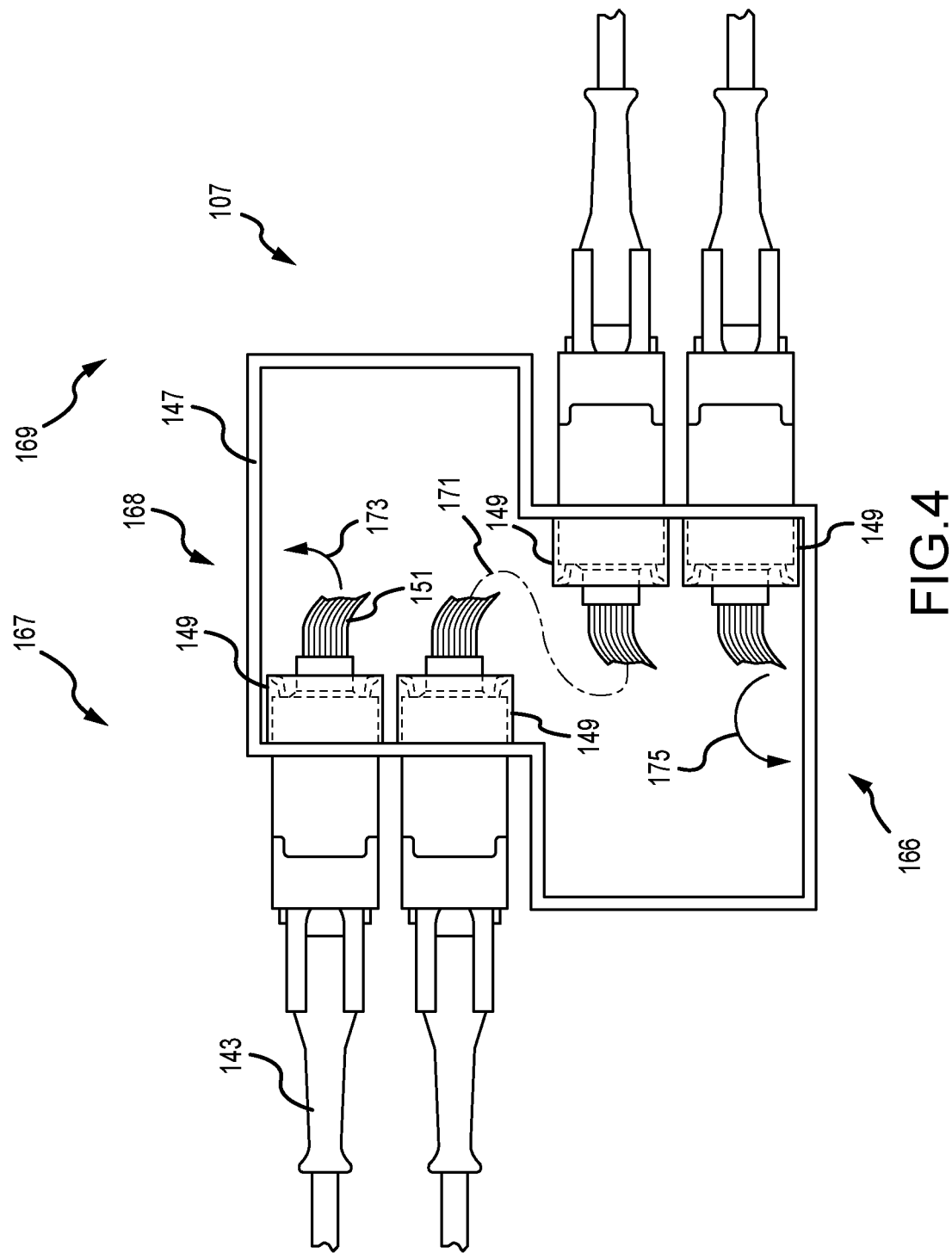
FIG. 4 depicts a top partial cut away view of an example of a cartridge of the system of FIG. 1 according to various embodiments.

FIG. 4 depicts a top partial cut away view of an example of the cartridge 107. The cartridge 107 may be situated to service or provide communication relative to differing sides, which will be referred to as an odd rack side 167 and an even rack side 169. The cartridge 107 may be installed so that a rear side 166 or a front side 168 of the cartridge 107 faces an inner or outer surface of an upright 111 or other portion of the rack 103, for example. Installing the cartridge 107 with the rear side 166 or front side 168 facing forward or backward may facilitate introduction of cables 143 from lateral directions, for example, although other orientations are also possible, including, but not limited to orientations in which the cartridge 107 is turned so that cables 143 can be introduced in a forward, backward, or other direction.

The upright rigid body 147 may be arranged to facilitate differing sorts of connections. The connectors 149 of the cartridge 107 may include and/or be connected with any suitable structure to facilitate signal routing for suitable connections among respective cables 143 that are engaged with the cartridge 107. Examples may include connection with internal conduits 151 by any suitable coupler and/or connectorized ends and/or segments. In some examples, the connectors 149 closest to the middle of the rigid body 147 may be arranged so that fiber optic ribbons or other conduits 151 can extend to establish connections between the odd rack side 167 and the even rack side 169, such as depicted by path 171. The path 171 may correspond to connections that connect a left side to a right side, for example. The path 171 may include routing that travels vertically (e.g., a direction into and/or out of the page in FIG. 4) between different levels. Utilizing the middle area within the rigid body 147 for connection between the odd rack side 167 and the even rack side 169 can leave other space for connections between a same side. For example, as may be identified by path 173, the cable 143 toward a top of the view in FIG. 4 (e.g., approaching from the odd rack side 167) may be received by and/or engaged with a connector 149 coupled with conduits 151 that may extend directly upwardly or downwardly (e.g., a direction into and/or out of the page in FIG. 4) in order to connect to other connectors 149 within the same side of the cartridge 107 so as to facilitate connections among different levels on the same side (e.g., along the odd rack side 167). Similarly, as may be identified by path 175, the connectors 149 toward a bottom of the view in FIG. 4 (e.g., approaching from the even rack side 169) may be coupled with conduits 151 that may extend directly upwardly or downwardly (e.g., into and/or out of the page in FIG. 4) to connect to other connectors 149 within the same side of the cartridge 107 so as to facilitate connections among different levels on the same side (e.g., along the even rack side 169).

Figure 5:
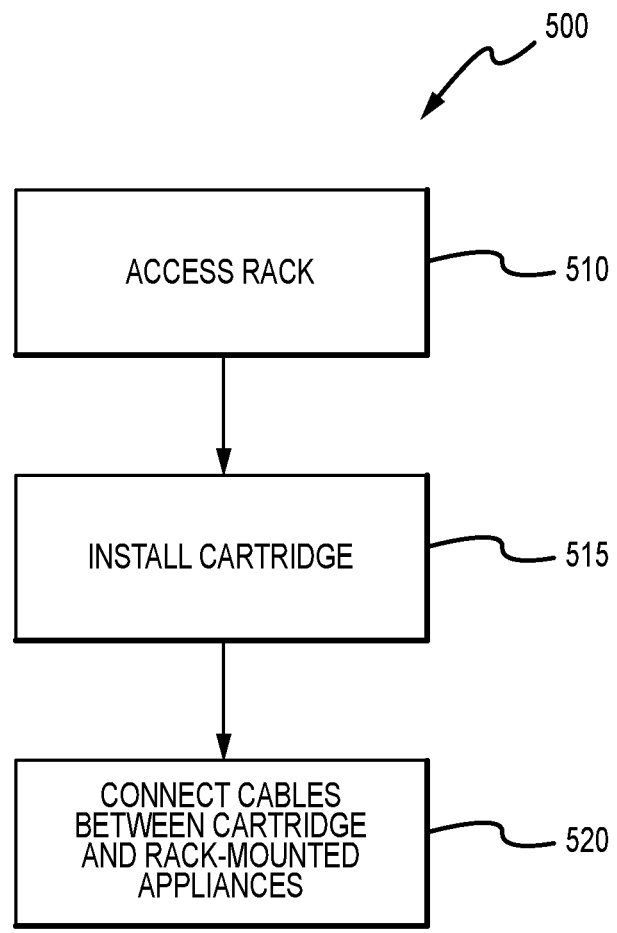
FIG. 5 is a flow chart illustrating an example process that may be implemented with the system of FIG. 1 according to various embodiments.

FIG. 5 is a flow chart illustrating an example of a process 500 that may be implemented, such as relative to elements of the system 101.

At 510, the process 500 can include accessing a rack. This may correspond to a rack 103, which may include the appliances 105 already installed or not yet installed.

At 515, the process 500 can include installing a cartridge. This may correspond to installing a cartridge 107, such as within a support zone 137. The installation at 515 may correspond to arranging the cartridge 107 within an internal volume 125 of the rack 103 or forward of the front face 123 of the rack 103. In some examples, the appliances 105 may be installed and/or may be moved into a seated position after the cartridge 107 is installed.

At 520, the process 500 can include connecting cables between the cartridge and rack-mounted appliances. The connecting at 520 can be preceded by supplying a suitable set of cables 143 for the connecting. The suitable set of cables can include a set of discrete lengths of cable 143, such as described with respect to FIG. 3. The connecting at 520 can include engaging cables 143 with the cartridge 107 and the appliances 105. Opposite ends of the cable 143 may be connected first to the cartridge 107 (e.g., connecting a plug 155 of the cable 143 with a connector 149 of the cartridge 107) and then to the appliance (e.g., connecting a plug 155 of the cable 143 with a port 163 of the appliance 105), or vice versa.

The connecting at 520 can including connecting cables 143 at different levels along a rack 103. For example, the connecting at 520 can include connecting a first cable 143 with an appliance 105 at one level and further connecting a second cable 143 with another appliance 105 at a second level. The first and second cables 143 can each be connected with the cartridge 107 so that the two appliances 105 at different levels are connected by a path that includes the first cable 143, at least one conduit 151 within the cartridge 107, and the second cable 143. The path between the two appliances 105 may correspond to a path between appliances 105 within the same rack 103 as one another or in different racks 103 from one another.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A racked and networked computing system, comprising:
a first rack and a second rack arranged laterally side by side within a two-rack footprint, each of the first rack and the second rack including a rack that comprises a frame having vertical uprights and transverse members coupled together so as to form boundaries of an internal volume of the rack, the internal volume including a sub-portion defining a receiving zone, the vertical uprights including a pair of front vertical uprights and a pair of back vertical uprights, the frame further defining a support zone positioned laterally from the receiving zone and positioned forward or rearward from one of the front vertical uprights;
a first plurality of appliances each comprising a computer server or a network hardware component and each slidably received in the receiving zone of the first rack;
a second plurality of appliances each comprising a computer server or a network hardware component and each slidably received in the receiving zone of the second rack;
a cartridge positioned at least partially within the support zone of at least one of the first rack or the second rack, the cartridge comprising an upright rigid body along which connectors are arranged, wherein the cartridge further comprises cabling within the upright rigid body, the cabling providing paths among subsets of the connectors;
a first cable extending from a first appliance of the first plurality of appliances to the cartridge; and
a second cable extending from a second appliance of the second plurality of appliances to the cartridge, wherein the first appliance is communicatively coupled with the second appliance by the first cable, the cabling in the cartridge, and the second cable.

2. The system of claim 1, wherein the first rack and the second rack are arranged with one of the front vertical uprights of the first rack abutting one of the front vertical uprights of the second rack.

3. The system of claim 1, wherein the cartridge is positioned at least partially within the support zone of the first rack and at least partially within the support zone of the second rack.

4. The system of claim 1, wherein the pair of front vertical uprights and the pair of back vertical uprights comprise:
a front primary vertical upright;
a back primary vertical upright spaced rearwardly from and laterally aligned with the front primary vertical upright along a primary lateral face of the frame;
a front secondary vertical upright aligned with the front primary vertical upright along a front face of the frame; and
a back secondary vertical upright spaced rearwardly from and laterally aligned with the front secondary vertical upright along a secondary lateral face of the frame, the second lateral face spaced laterally from the primary lateral face so as to each bound an internal volume of the frame that includes a plurality of berths sized for receiving electronic appliances therein.

5. A system, comprising:
a rack comprising:
a frame having vertical uprights coupled together with transverse members, the vertical uprights comprising:
a front primary vertical upright;
a back primary vertical upright spaced rearwardly from and laterally aligned with the front primary vertical upright along a primary lateral face of the frame;
a front secondary vertical upright aligned with the front primary vertical upright along a front face of the frame; and
a back secondary vertical upright spaced rearwardly from and laterally aligned with the front secondary vertical upright along a secondary lateral face of the frame, the second lateral face spaced laterally from the primary lateral face so as to each bound an internal volume of the frame that includes a plurality of berths sized for receiving electronic appliances therein; and
a cartridge comprising an upright rigid body along which connectors are arranged, wherein the cartridge further comprises cabling within the upright rigid body, the cabling providing paths among subsets of the connectors, wherein the cartridge is coupled with the frame so as to be positioned laterally outward from the berths, along and laterally inward from the primary lateral face or the second lateral face, and forward or rearward of the front face of the frame.

6. The system of claim 5, further comprising:
a first cable coupleable with the cartridge; and
a second cable coupleable with the cartridge so as to be communicatively coupled with the first cable via the cabling within the cartridge.

7. The system of claim 5, further comprising an appliance receivable within one of the berths.

8. The system of claim 7, wherein the appliance is a first appliance, and wherein the system further comprises:
a second appliance;
a first cable coupling the first appliance with the cartridge; and
a second cable coupling the second appliance with the cartridge so as to establish a signal path between the first appliance and the second appliance through the first cable, the cartridge, and the second cable.

9. The system of claim 8, wherein the second appliance is received at least partially within the internal volume of the frame.

10. The system of claim 8, wherein the rack is a first rack, and wherein the second appliance is located within a second rack positioned adjacent to the first rack.

11. The system of claim 5, wherein the cartridge comprises an outside interface along a top of the cartridge and configured for receiving at least one conduit so as to establish a connection for signal travel between the at least one conduit and at least one of the connectors of the cartridge.

12. The system of claim 5, wherein the cartridge is sized to fit within a width of the front primary vertical upright or the front secondary vertical upright.

13. The system of claim 5, wherein the cartridge is sized to fit within a combined width corresponding to a width of the front primary vertical upright combined with a width the front secondary vertical upright.

14. A method comprising:
accessing a rack, the rack comprising a frame having vertical uprights and transverse members coupled together so as to form boundaries of an internal volume of the rack, the boundaries including a first lateral face, a second lateral face, a front face, and a back face;
installing a cartridge forward or rearward of the front face and laterally inward from the first lateral face or the second lateral face; and
connecting cables between the cartridge and a plurality of appliances, the cables including a first cable extending between the cartridge and a first appliance supported by the rack, the cables further including a second cable extending between a second appliance and the cartridge so as to establish a signal path between the first appliance and the second appliance through the first cable, the cartridge, and the second cable.

15. The method of claim 14, wherein the second appliance is supported by the rack.

16. The method of claim 14, wherein the rack is a first rack and the second appliance is supported by a second rack adjacent the first rack.

17. The method of claim 14, wherein installing the cartridge comprises installing the cartridge within a space defined by a width no larger than one of the vertical uprights.

18. The method of claim 14, wherein the rack is a first rack adjacent a second rack, wherein installing the cartridge comprises installing the cartridge within a space defined by a width of adjacent vertical uprights of the first rack and the second rack.

19. The method of claim 14, wherein installing the cartridge comprises installing the cartridge rearward of the front face.

20. The method of claim 14, wherein installing the cartridge comprises installing the cartridge forward of the front face.

* * * * *